(12) United States Patent
Fornara et al.

(10) Patent No.: US 8,692,247 B2
(45) Date of Patent: Apr. 8, 2014

(54) INTEGRATED MECHANICAL DEVICE FOR ELECTRICAL SWITCHING

(71) Applicant: STMicroelectronics (Rousset) SAS, Rousset (FR)

(72) Inventors: Pascal Fornara, Pourrieres (FR); Christian Rivero, Rousset (FR); Antonio di-Giacomo, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 13/687,932

(22) Filed: Nov. 28, 2012

(65) Prior Publication Data

US 2013/0146873 A1    Jun. 13, 2013

(30) Foreign Application Priority Data

Dec. 9, 2011   (FR) ...................... 11 61407

(51) Int. Cl.
*H01L 23/58*      (2006.01)
(52) U.S. Cl.
USPC ........................................... 257/48; 257/467
(58) Field of Classification Search
USPC .................................................. 257/48, 467
See application file for complete search history.

(56) References Cited

U.S. PATENT DOCUMENTS

| | | | |
|---|---|---|---|
| 7,960,804 B1 * | 6/2011 | Ebel et al. | 257/415 |
| 2005/0146404 A1 * | 7/2005 | Yeatman | 335/78 |
| 2005/0189204 A1 * | 9/2005 | Yeatman et al. | 200/181 |
| 2010/0158072 A1 | 6/2010 | Fornara et al. | |
| 2013/0147004 A1 * | 6/2013 | Rivero et al. | 257/467 |

FOREIGN PATENT DOCUMENTS

EP    2 202 767 A1    6/2010

OTHER PUBLICATIONS

Vayrette, R., et al., "Residual stress estimation in damascene copper interconnects using embedded sensors," Microelectronic Engineering, vol. 87, Issue 3, Mar. 2010, pp. 412-415.

* cited by examiner

*Primary Examiner* — Trung Q Dang
(74) *Attorney, Agent, or Firm* — Slater & Matsil, L.L.P.

(57) ABSTRACT

An integrated circuit comprising a mechanical device for electrical switching comprising a first assembly being thermally deformable and having a beam held at at least two different locations by at least two arms, the beam and the arms being metal and disposed within the same metallization level, and further comprising at least one electrically conducting body. The first assembly has a first configuration at a first temperature and a second configuration at a second temperature different from the first temperature. The beam is out of contact with the electrically conducting body in one configuration in contact with the body in the other configuration. The beam establishes or breaks an electrical link passing through the said at least one electrically conducting body and through the said beam in the different configurations.

20 Claims, 11 Drawing Sheets

INTEGRATED MECHANICAL DEVICE FOR ELECTRICAL SWITCHING

This application claims the benefit of French Application No. 1161407, filed on Dec. 9, 2011, entitled "Integrated Mechanical Device for Electrical Switching," which application is hereby incorporated herein by reference.

TECHNICAL FIELD

The invention relates to integrated circuits, and more particularly, devices for electrical switching such as switches or selector switches, in particular mechanical devices that may be thermally or electrically activated.

The invention is advantageously applicable to, but not limited to, the temperature detection thresholds within a product incorporating such an integrated circuit.

BACKGROUND

At the present time, the switching devices formed within integrated circuits are generally selector switches of the Micro Electro Mechanical System (or MEMS) type using elements made of polysilicon. However, the technology used for fabricating such selector switches is a dedicated technology, difficult to integrate into a standard CMOS technological line.

With the aim of evaluating a temperature, resistance measurements may also be used. However, such temperature detectors need an electrical power supply. They do not operate in switched-off mode and their very operation has an impact on the temperature measurement.

Other temperature detectors can only detect an increase in temperature. This is the case for example of that described in EP 2 202 767.

SUMMARY OF THE INVENTION

In one aspect, embodiments of the presented principles provide for an integrated circuit comprising a plurality of metallization levels separated by an insulating region and disposed on a substrate and a mechanical device for electrical switching. The mechanical device may comprise a first assembly being thermally deformable and disposed within an enclosure and may have a beam held at at least two different locations by at least two arms rigidly attached to edges of the enclosure and at least one electrically conducting body. The beam and the arms may be metal and disposed within a same metallization level. The first assembly may have at least a first configuration at a first temperature and a second configuration when at least one of the arms is at a second temperature different from the first temperature. The beam is out of contact with the said at least one electrically conducting body in one of the first configuration and second configuration and in contact with the said at least one electrically conducting body in the other of the first configuration and the second configuration and establishing or breaking an electrical link passing through the said at least one electrically conducting body and through the said beam. The said first assembly is activatable for switching from one of the configurations to another configuration.

Another embodiment of the presented principles provides for a device comprising at least one first body formed at least in part of an electrically conducting material, a beam formed of an electrically conductive material and disposed with an enclosure and within a first metallization layer and at least two first arms rigidly attached to edges of an enclosure and disposed within the first metallization layer. The at least two first arms are thermally deformable, and the at least two first arms and the beam form a first assembly. The at least two first arms are configured to move the beam in response to a change in temperature, with the first assembly having at least a first configuration at a first temperature and a second configuration when at least one of the at least two first arms is at a second temperature different from the first temperature. The beam is out of contact with the at least one first body in the first configuration such that no electrical link passes through the at least one first body and through the said beam, and in contact with the at least one first body in the second configuration such that an electrical link passes through the at least one first body and through the beam.

Another embodiment of the presented principles provides for a device comprising a first body disposed in an enclosure and formed of a conductive material, a first arm attached to the enclosure, a second arm attached to the enclosure, and a first beam formed of a conductive material. The first arm is attached at a first point to a first face of the first beam at a first end of the first beam, and the second arm is attached at a second point to a second face of the first beam opposite the first face of the first beam, the second point between the first point and a second end of the first beam opposite the first end of the first beam. The first arm and the second arm are configured to move the first beam from not being in contact at a second end of the first beam with the first body at a first temperature to being in contact at the second end of the first beam with the first body at a second temperature. The first beam establishes an electrical link through the first body and the first beam at the second temperature. The first arm, the second arm and the first beam are formed in a same metallization layer.

BRIEF DESCRIPTION OF THE DRAWINGS

Other advantages and features of the invention will become apparent upon examining the detailed description of non-limiting embodiments and of the appended drawings in which.

DETAILED DESCRIPTION OF ILLUSTRATIVE EMBODIMENTS

Figure 1:
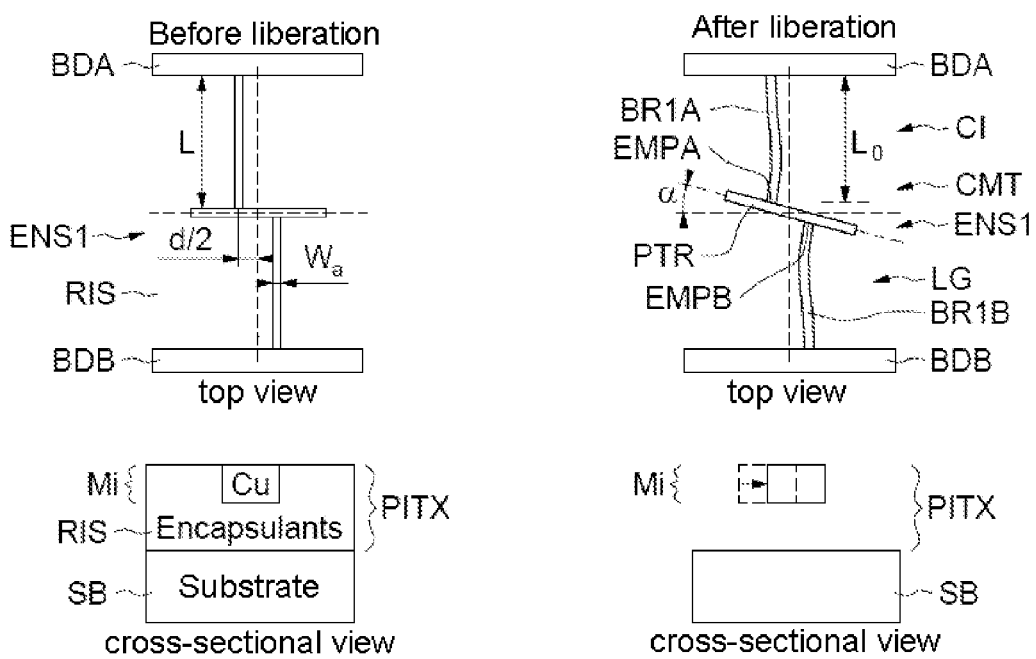
FIGS. 1 to 16, some of which are schematic, relate to various embodiments of a device according to the invention.

Before addressing the illustrated embodiments in detail, various embodiments and advantageous features are discussed generally in the following paragraphs.

According to one embodiment, a novel mechanical device for electrical switching is provided which may be integrated into all the CMOS technological lines by the addition potentially of only a few additional operations (the addition of one mask level, for example), and without using the conventional technology of the MEMS type.

According to one embodiment, a switching device is also provided which has a limited impact in terms of surface area within the integrated circuit.

According to one embodiment, a switching device is also provided which may be used as a temperature detector both for detecting an increase in temperature or else a fall in temperature, and while potentially not being supplied with power.

According to one embodiment, the use of at least one thermally deformable assembly is thus provided, formed within a metallization level of the integrated circuit, and using the physical behavior of the metal forming this thermally deformable assembly subjected to a variation in temperature so as to establish or break at least one electrical link passing through at least a part of this thermally deformable assembly, and through a buffer against which can push a beam or pointer of this thermally deformable assembly.

According to one aspect, an integrated circuit is provided comprising on top of a substrate a part comprising several metallization levels separated by an insulating region. Such a part is commonly denoted by those skilled in the art by the acronym BEOL (for "Back End Of Line").

According to one general feature of this aspect, the integrated circuit furthermore comprises, within the said part, a mechanical device for electrical switching comprising, within an enclosure, a first thermally deformable assembly including a beam held at at least two different locations by at least two arms rigidly attached to edges of the enclosure, the beam and the arms being metal and situated within the same metallization level; the electrical switching device also comprises at least one electrically conducting body, for example a metal buffer; this first assembly has at least one first configuration when it has a first temperature, for example ambient temperature of the integrated circuit, and a second configuration when at least one of the arms has a second temperature different from the first temperature, for example a higher temperature; the beam is out of contact with the said at least one body in one of the two configurations, and in contact with the said at least one body in the other configuration, so as to establish or break an electrical link passing through the said at least one body and through the said beam, and the said first assembly being activatable for switching from one of the configurations to another configuration.

Such a mechanical switching device, allowing an electrical link to be established or to be broken, is thus formed in the part referred to as BEOL of the integrated circuits, within the same metallization level, and therefore has an essentially two-dimensional and metal structure. It is therefore readily integrated into a CMOS technological line by broadly using the conventional fabrication steps of the BEOL part of the integrated circuit.

The first, thermally deformable, assembly can be thermally activatable or else electrically activatable, the increase in temperature being, in the latter case, obtained by Joule heating by the flow of a current within the first assembly.

Various embodiments of the assembly are possible, comprising a beam held in various locations by at least two arms or even two pairs of arms, at least some of the arms being able to comprise several parallel branches.

Similarly, the body against which the beam of the first assembly comes into contact in one of the configurations can comprise one or even several buffers, or potentially another thermally deformable assembly.

Referring to FIG. 1, it can be seen that the mechanical switching device or selector switch CMT is formed within the same metallization level Mi of the interconnection part PITX of the integrated circuit CI, this interconnection part also being commonly denoted by those skilled in the art by the acronym BEOL.

This part PITX is situated on top of the substrate SB.

In the examples described here, the selector switch CMT is made of metal, and more particularly of copper. However, the metal could be aluminium or tungsten without these two examples being limiting.

The selector switch CMT here comprises an assembly ENS1 in the shape of an asymmetric cross. This assembly ENS1 comprises a first arm BR1A and a second arm BR1B rigidly attached to a beam PTR, also given the name "central pointer", at two locations EMPA EMPB respectively situated on two opposing faces of the beam PTR. These two locations EMPA and EMPB are spaced out by a distance d.

As will be seen in more detail hereinafter, the assembly ENS1 is formed using conventional fabrication techniques for the metal tracks of the interconnection part PITX, used notably in CMOS technology.

The left-hand part of FIG. 1 shows the selector switch CMT, and more particularly the assembly ENS1 encapsulated within an insulating region RIS, whereas the right-hand part of FIG. 1 shows the same assembly after etching away of the insulating region so as to liberate the arms BR1A and BR1B together with the beam PTR.

The assembly ENS1, thus liberated, therefore lies inside an enclosure LG resulting from the etching away of the insulating region RIS, the two arms BR1A and BR1B being rigidly attached to the edges BDA and BDB of the enclosure.

In the article by R. Vayrette et al. entitled: "Residual stress estimation in damascene copper interconnects using embedded sensors", Microelectronics Engineering 87 (2010) 412-415, it has been shown that after "disencapsulation" of an assembly of this type, a relaxation of the stresses takes place which causes a residual longitudinal deformation of the arms causing a deviation a of the pointer, here in the clockwise direction.

More precisely, if the arm is assumed to have a constant width Wa, the deviation a is expressed by the following formula:

$$a = \frac{d \cdot L \cdot L_0 (L - L_0)}{d^2 (2L - L_0) + \frac{4}{3} \cdot W_a^2 \cdot L_0}$$

where L0 is the length of the arms after relaxation $$L0 \text{ is equal to } \frac{L}{1 + \frac{\sigma}{E}}$$

where σ denotes the average residual longitudinal stress and E the Young's modulus of the material (equal to around 130 GPa for isotropic copper).

σ is determined experimentally from measurements carried out on test structures having various values of d and various values of Wa. Thus, for 1/d equal to 2 μm−1 and Wa equal to 0.5 μm, σ is equal to around 800 MPa.

By way of example, for arms of length 10 microns and of width 0.2 microns, the deviation of the pointer is around 0.2 microns for a spacing d of 2 microns. For a spacing of 1 micron, the deviation a is around 0.3 microns. This is understood to be for switches annealed at 400° with an insulating region RIS of 0.56 microns.

For a line width (width of arm) of around 0.2 microns, an average residual longitudinal deformation is obtained in the range between 0.25% and 0.30% for a line width (width of the arms) of 0.5 microns, 0.20% for a line width of 1 micron, and a little less than 0.20% for a line width of 2 microns.

Depending on the applications envisaged, and notably depending on the desired precision, for example in the case of a temperature detection, this residual deviation a of the pointer PTR may or may not be taken into account.

Figure 2:
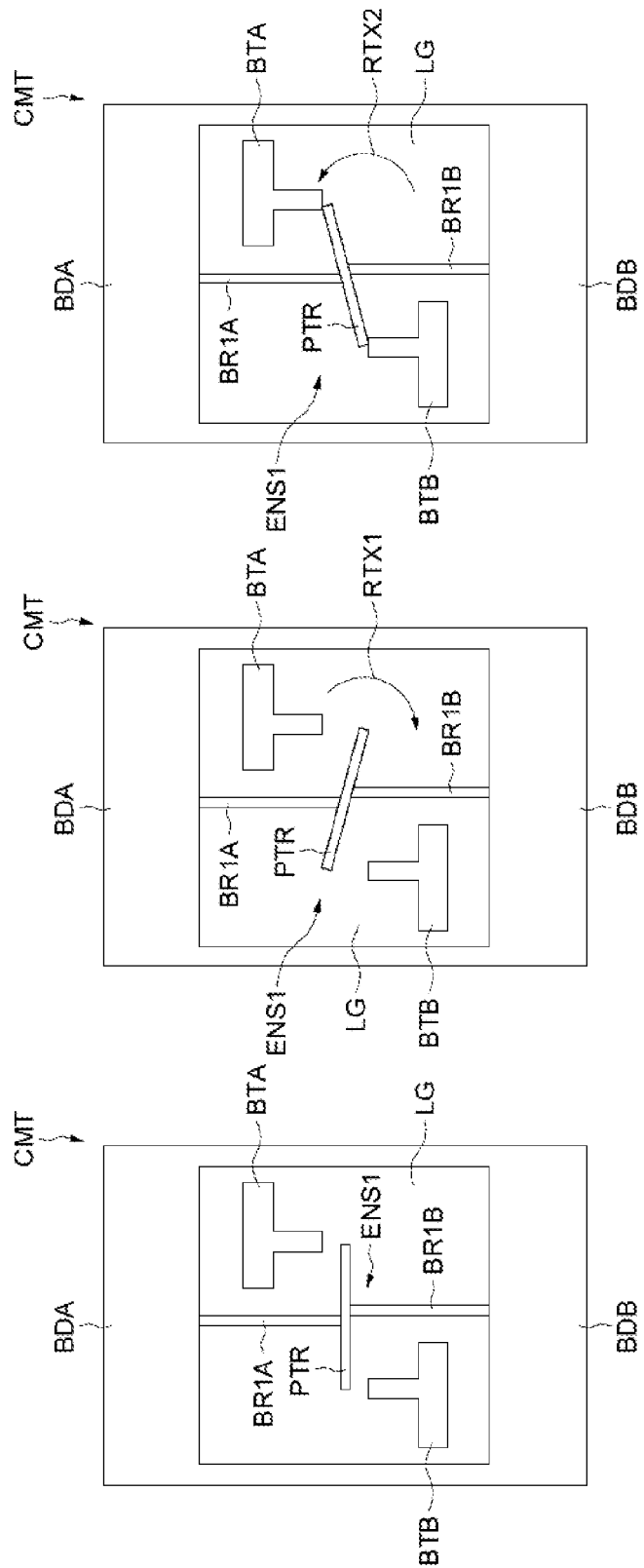

In the example illustrated in FIG. 2, the selector switch CMT comprises, aside from the assembly ENS1, two electrically conducting buffers BTA and BTB, for example two metal buffers, also formed within the same metallization level as that in which the assembly ENS1 was formed.

In the left-hand part of FIG. 2, the assembly ENS1 is shown before disencapsulation of the insulating region RIS and, in the central part of FIG. 2, the same assembly ENS1 is shown after disencapsulation, in other words liberated from the insulating region RIS. In the example shown here, the residual deviation of the beam PTR (pointer) is taken into account that is associated with the relaxation of the stresses when the assembly ENS1 is liberated from the insulating region RIS which was surrounding it.

In the central part of FIG. 2, the first assembly ENS1 then has a first configuration when it has a first temperature, for example ambient temperature. In this first configuration, the beam PTR is out of contact with the two buffers BTA and BTB and no electrical link can pass through these buffers and the beam PTR.

In the right-hand part of FIG. 2, the assembly ENS1 has been thermally activated in order to assume a second configuration in which the beam PTR comes into contact with the two buffers BTA and BTB.

This thermal activation has been caused by an increase in temperature of the expansion arms BR1A and BR1B.

Indeed, owing to the increase in temperature, these arms expand and, since the two fixing points of the two arms BR1A and BR1B onto the beam PTR are spaced out in the longitudinal direction of the beam, this expansion causes a non-zero moment of force resulting in a rotation RTX2 of the beam PTR in the anticlockwise direction, the rotation RTX2 being the reverse of the rotation RTX1 (central part of FIG. 2) resulting from the relaxation of the stresses on the assembly ENS1.

With a knowledge of the thermal coefficient of expansion of the material forming the expansion arms, the geometry of the arms BR1A and BR1B, notably their length and their width together with their thickness, and the spacing d between the two fixing points, the deviation of the pointer PTR resulting from the rotation RTX2 can readily be simulated.

As a consequence, the buffers BTA and BTB can be positioned within the enclosure such that beyond a threshold temperature, the beam PTR comes into contact with these two buffers BTA and BTB.

It then becomes possible to establish an electrical link passing through the buffers BTA, BTB and through the beam PTR.

Figure 3:
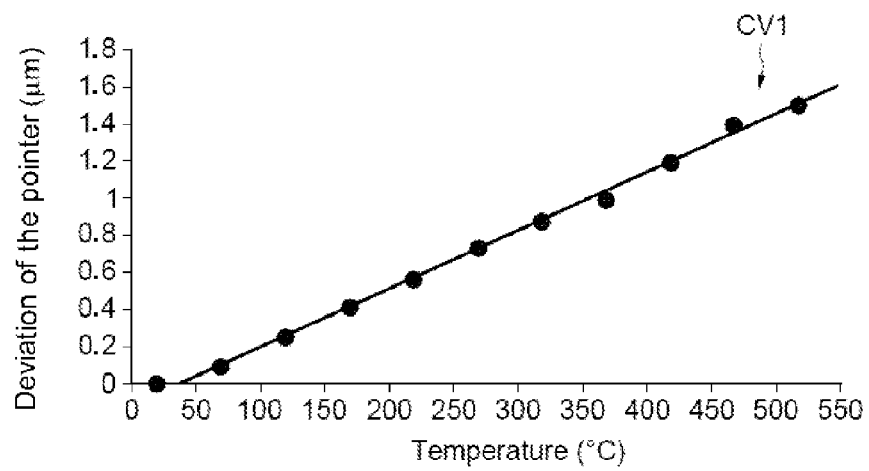

By way of example, for an arm width of 0.2 micron, an arm length of 10 microns and a spacing of 0.4 micron, the curve CV1 (FIG. 3) illustrates the deviation of the pointer PTR as a function of temperature.

Figure 4:
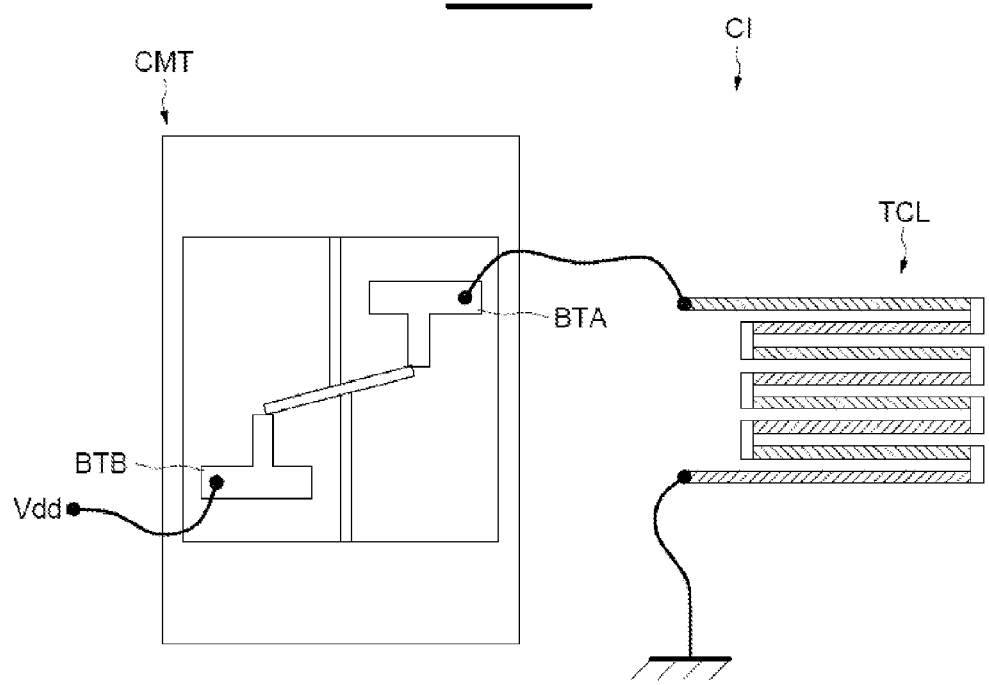
Figure 5:
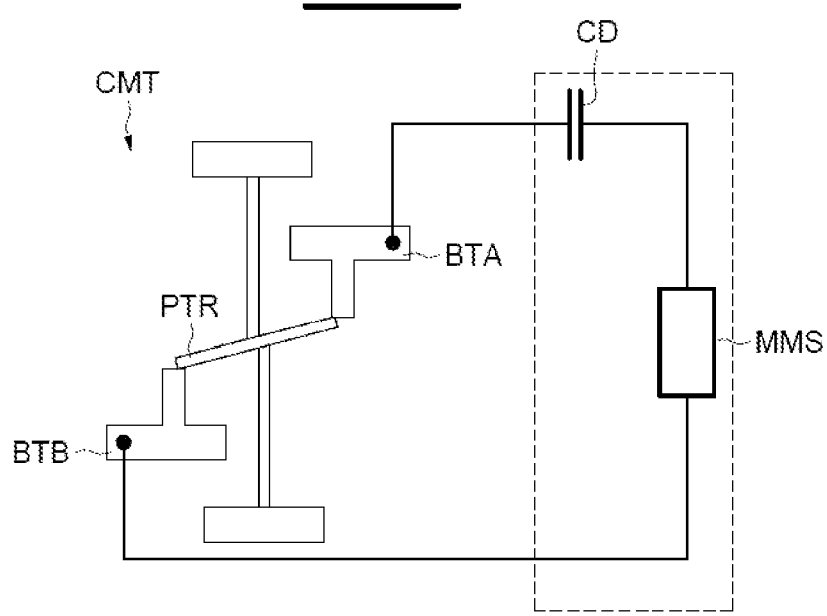

Examples of applications are illustrated schematically in FIGS. 4 and 5.

In FIG. 4, when the temperature of the integrated circuit exceeds a threshold, the switch CMT allows a cooling of the latter to be automatically triggered by the use for example of a cooling element TCL based on PN pairs using the Peltier effect.

More precisely, the buffer BTB is connected to the power supply voltage Vdd, whereas the buffer BTA is connected to one of the terminals of the cooling element TCL while the other terminal of the cooling element TCL is connected to ground.

When the temperature of the integrated circuit exceeds a certain threshold, the beam PTR of the assembly ENS1 comes into contact with the buffers BTA and BTB, therefore creating an electrical link passing through these buffers BTA and BTB and the beam PTR and hence connecting the first input of the cooling element TCL to the voltage Vdd.

The passage of the current in the cooling element TCL creates, by the Peltier effect, a warm region and a cold region, the cold region allowing the desired part of the integrated circuit to be cooled.

In FIG. 5, the switch CMT operates as a temperature detector without the latter needing to be powered. More precisely, the buffer BTR1 is connected to a charged up capacitor CD, itself connected to the buffer BTB.

When, as illustrated in FIG. 5, the temperature of the integrated circuit exceeds a predefined threshold, the beam PTR comes into contact with the buffers BTA and BTB, therefore creating an electrical link between the two terminals of the capacitor CD and allowing the latter to discharge. Measurement means MMS, that are conventional and known per se, allow this current to be detected and hence information to be provided indicating that the temperature of the integrated circuit has exceeded a certain threshold.

When such an integrated circuit is inserted into a product, for example food packaging, a break in the cold process chain can thus be detected.

Figure 6:
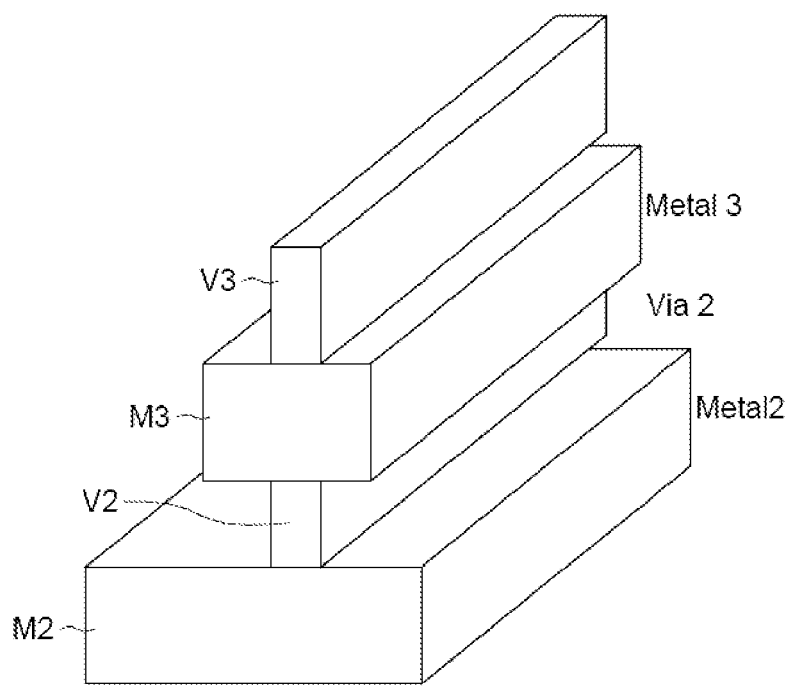
Figure 7:
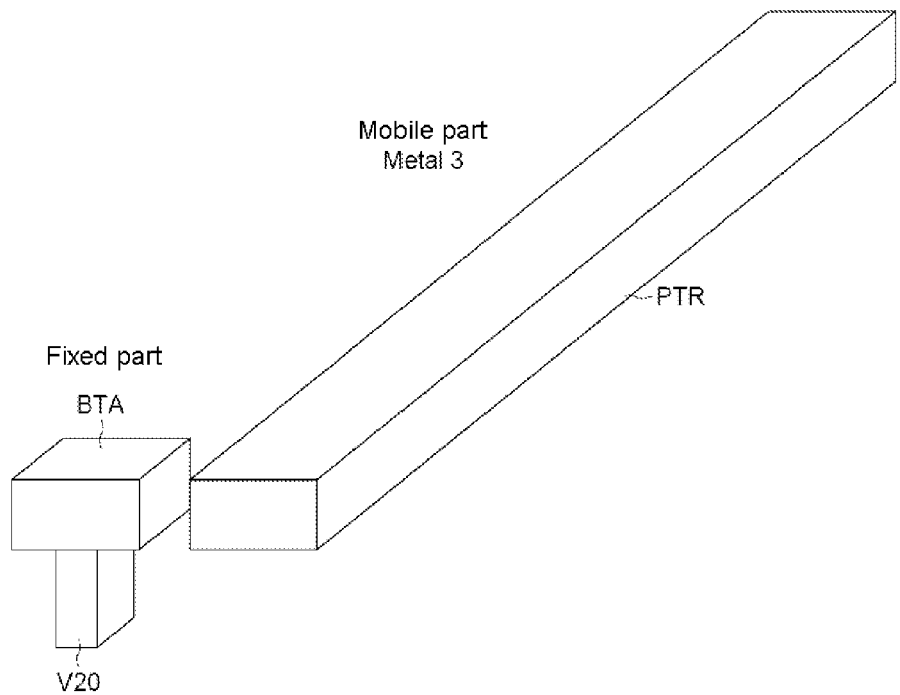
Figure 8:
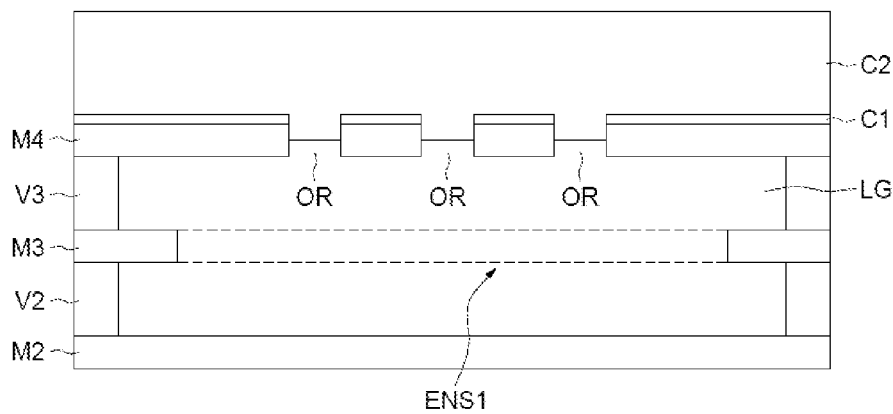

Reference is now more particularly made to FIGS. 6 to 8, in order to illustrate a mode of fabrication of one exemplary embodiment of a switch CMT according to the invention.

In these figures, it is assumed that the assembly ENS1, and also the buffers, are formed within the metallization level M3 (Metal 3).

It can then be seen (FIG. 6) that the level V2 of vias 2 between the metal level 2 and the metal level 3 and the level V3 of vias 3 between the metal 3 and the metal 4 are used to form a "protective wall" for the subsequent oxide etch and to allow the disencapsulation of the assembly ENS1 and of the various buffers.

Furthermore, as illustrated in FIG. 7, both the mobile part of the selector switch CMT, in this case the beam PTR, and the fixed part, in this case the buffer BTA, are formed at the level of the metal 3. Furthermore, the buffer BTA is connected to the metal level 2 by a via V20.

The switch CMT, and notably the assembly ENS1, are formed by using conventional fabrication steps for metallization levels and for vias. More precisely, as illustrated in FIG. 8, after forming the metal level M2 and via level V2, the assembly ENS1, shown here as a dashed line for simplification, is formed in a conventional manner by etching of the underlying oxide and deposition of metal, in this case copper, into the trenches. Then, the whole assembly is covered with oxide and the metallization level M4 is then formed.

After formation on the metal level 4 of a conventional layer of nitride C1, a comb is then formed within this metal level 4 so as to form orifices OR.

Subsequently, an isotropic dry etching step is carried out followed by a wet etching step, for example with hydrofluoric acid, so as to remove the insulating region (oxide) encapsulating the assembly ENS1, together with the various buffers, and thus to also form the enclosure LG.

Then, a non-conformal deposition of oxide is carried out so as to form a layer C2 filling the orifices OR.

It goes without saying that what has just been described for the metal levels M2, M3, M4 can be generalized to the metal levels Mi−1, Mi, Mi+1.

The conventional process for formation of the various upper metallization levels is then carried out.

Figure 9:
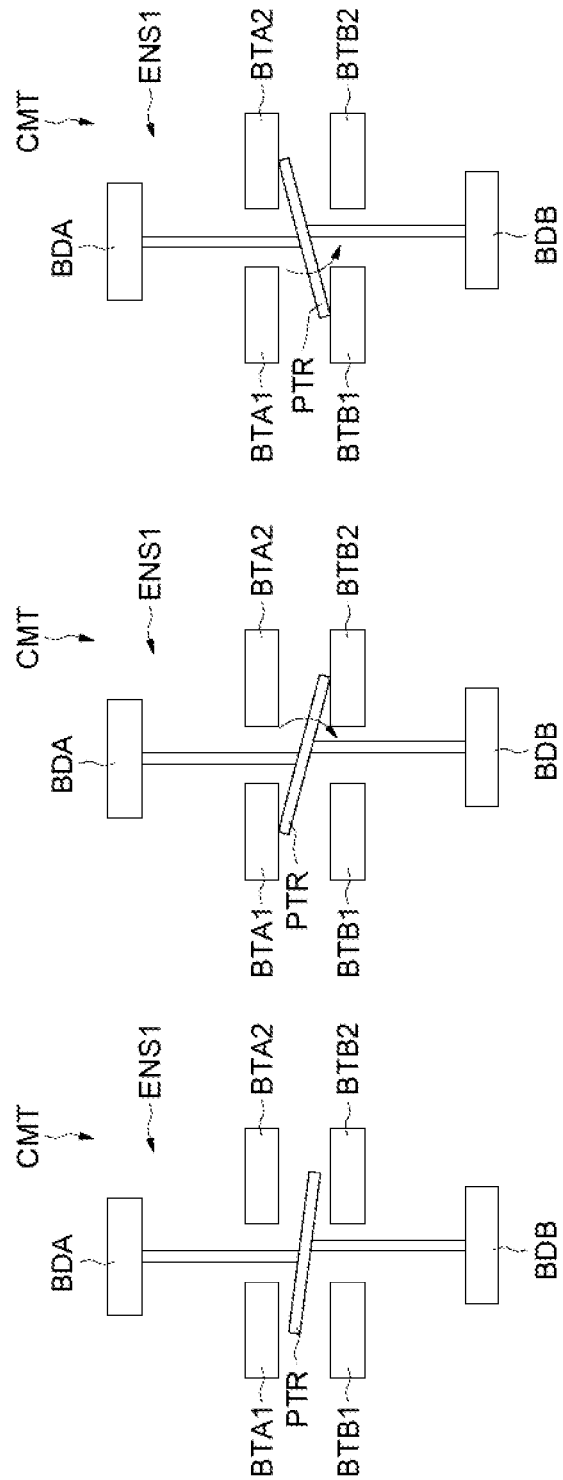

In FIG. 9, a switch CMT is shown very schematically that allows both a fall in temperature and also an increase in temperature to be detected.

More precisely, in the left-hand part of FIG. 9, the selector switch CMT is shown in its first configuration, at ambient temperature, after disencapsulation and relaxation of the stresses. In this first configuration, the beam PTR is out of contact with the four buffers BTA1, BTA2, BTB1 and BTB2.

When the temperature falls below a first threshold, thermal contraction of the arms of the assembly ENS1 then occurs and the beam undergoes a rotation in the clockwise direction so as to come into contact with the buffers BTA1 and BTB2 and allow the establishment of an electrical link between these two buffers (FIG. 9, central part).

On the other hand, for an increase in temperature, the beam PTR comes into contact with the buffers BTB1 and BTA2 when the temperature rises above a second predetermined threshold. This time, an electrical link is established passing through the beam PTR and the buffers BTA2 and BTB1 (FIG. 9, right-hand part).

Other variant embodiments of the selector switch CMT are possible.

Figure 10:
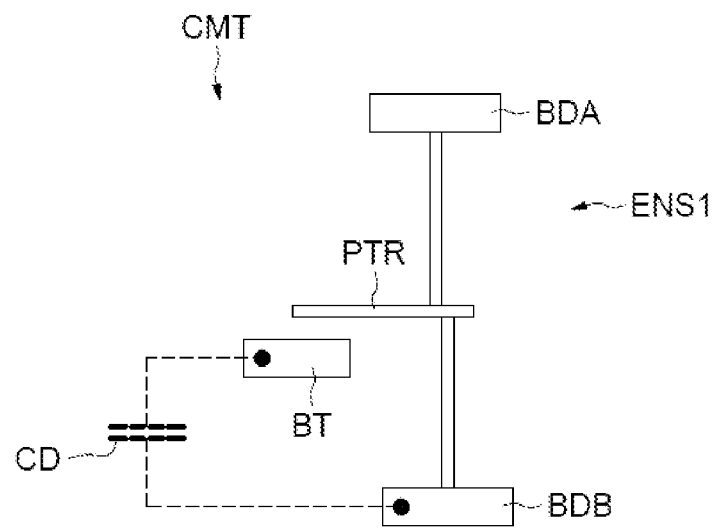

Thus, as illustrated in FIG. 10, the two arms of the assembly ENS1 are connected in the neighbourhood of a first end of the beam PTR. The two fixing points of the two arms onto the beam are of course here again spaced out in the longitudinal direction of the beam PTR.

The other end of the beam PTR can then come into contact, or not, with an electrically-conducting buffer BT, for example a metal buffer, depending on the temperature applied to the assembly ENS1.

In the example described here, a charged capacitor CD is connected between the buffer BT and the edge BDB of the enclosure. And, when the temperature exceeds a predetermined threshold, the beam PTR then comes into contact with the buffer BT, allowing the capacitor to discharge. The detection of this discharge is representative of the temperature of the integrated circuit exceeding a threshold.

Figure 11:
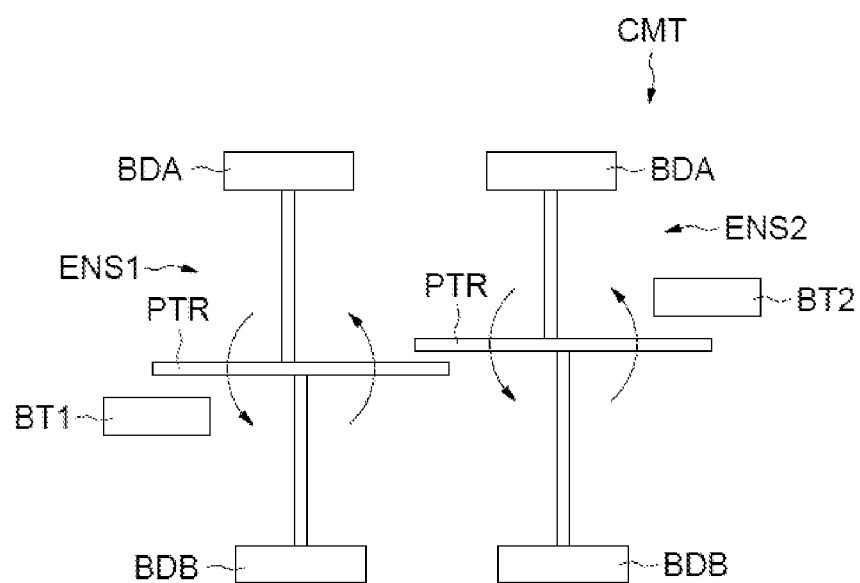

In the exemplary embodiment illustrated in FIG. 11, the switch CMT comprises two assemblies, here identical, ENS1 and ENS2.

The assembly ENS2 will act as a buffer for the assembly ENS1.

More precisely, when the temperature increases, the beam PTR of the assembly ENS1 will come into contact with the buffer BT1 and also into contact with the beam PTR of the assembly ENS2 having also undergone a rotation owing to the increase in temperature of the assembly ENS2. In other words, the neighbouring ends of the two beams PTR have then come closer together.

Furthermore, the other end of the beam PTR of the assembly ENS2 comes into contact with the buffer BT2.

An electrical link can then be established between the buffers BT1 and BT2 by means of the two beams PTR in contact with the two assemblies ENS1 and ENS2.

Such an embodiment, owing to the beams PTR of the two ensembles moving towards each other, allows an enhanced certainty to be obtained with regard to the establishment of an electrical link dependent on the temperature.

Figure 12:
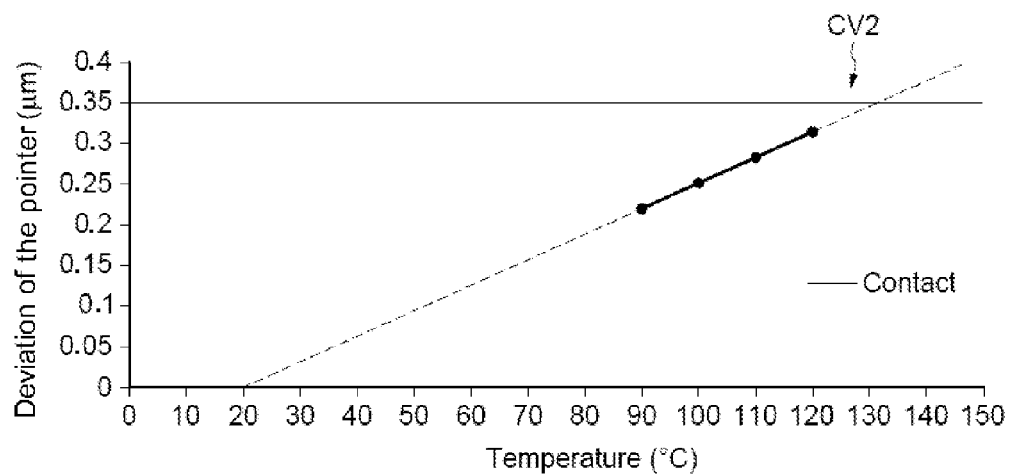

Thus, in FIG. 12, the curve CV2 shows, by way of example, the deviation of the two pointers PTR of the two ensembles as a function of temperature for line widths of 0.2 micron.

It can be seen, in this case, that the contact will be made for a temperature of around 130°.

In the embodiments that have just been described, it has been indicated that the assembly or assemblies ENS1 are thermally activatable.

Figure 13:
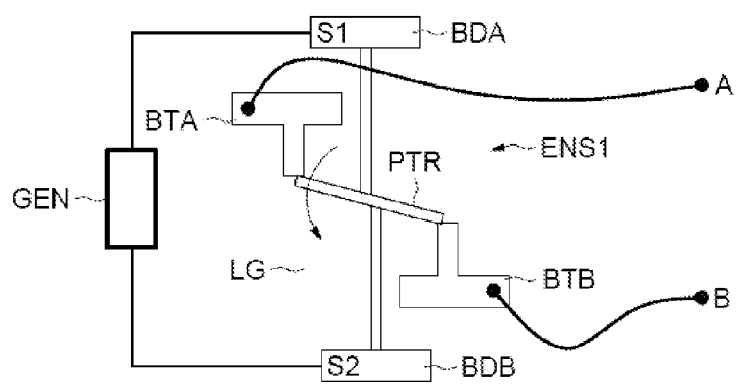

As a variant, as illustrated in FIG. 13, the thermally deformable assembly ENS1 can be electrically activated.

Indeed, means GEN, being conventional and known per se, are then provided that are capable of driving an electrical current in at least one of the arms of the assembly ENS1, in this case here in the two arms ENS1, between the two edges BDA and BDB of the enclosure.

As a result, Joule heating produces an increase in temperature of the two arms which causes the deviation of the beam PTR.

In the example illustrated in FIG. 13, the selector switch is in a state referred to as "normally closed" (or "normally ON"), in other words, at ambient temperature, the beam PTR is in contact with the buffers BTA and BTB which are what allows an electrical link between the points A and B to be established.

On the other hand, when a potential difference is applied between the points S1 and S2, in other words between the edges BDA and BDB of the enclosure LG, the beam PTR undergoes a rotation which places it out of electrical contact with the buffers BTA and BTB, interrupting the electrical link between the points A and B. It should be noted here that an impedance will preferably be chosen for the circuit A-B that is sufficiently high so as to force the current to pass in the assembly ENS1 and accordingly obtain a thermal expansion of the two arms of the assembly.

Figure 14:
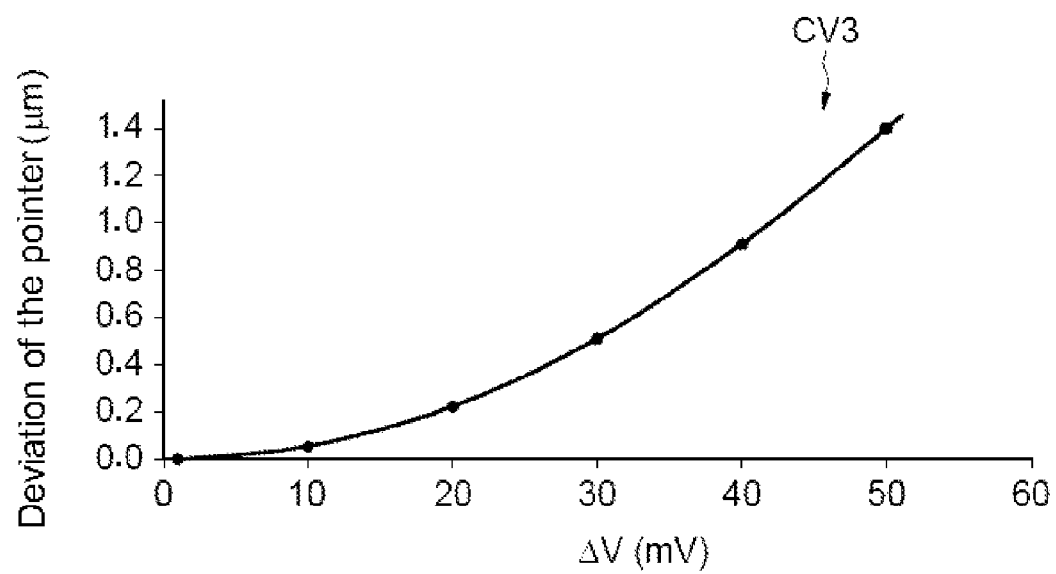

FIG. 14 illustrates, by way of example, a curve CV3 showing the variation of the deviation of the pointer PTR as a function of the potential difference applied between the points S1 and S2, still for a line width of 0.2 micron.

It goes without saying that all the embodiments that have been described prior to FIG. 13 may also be used when the switch is electrically activatable.

Figure 15:
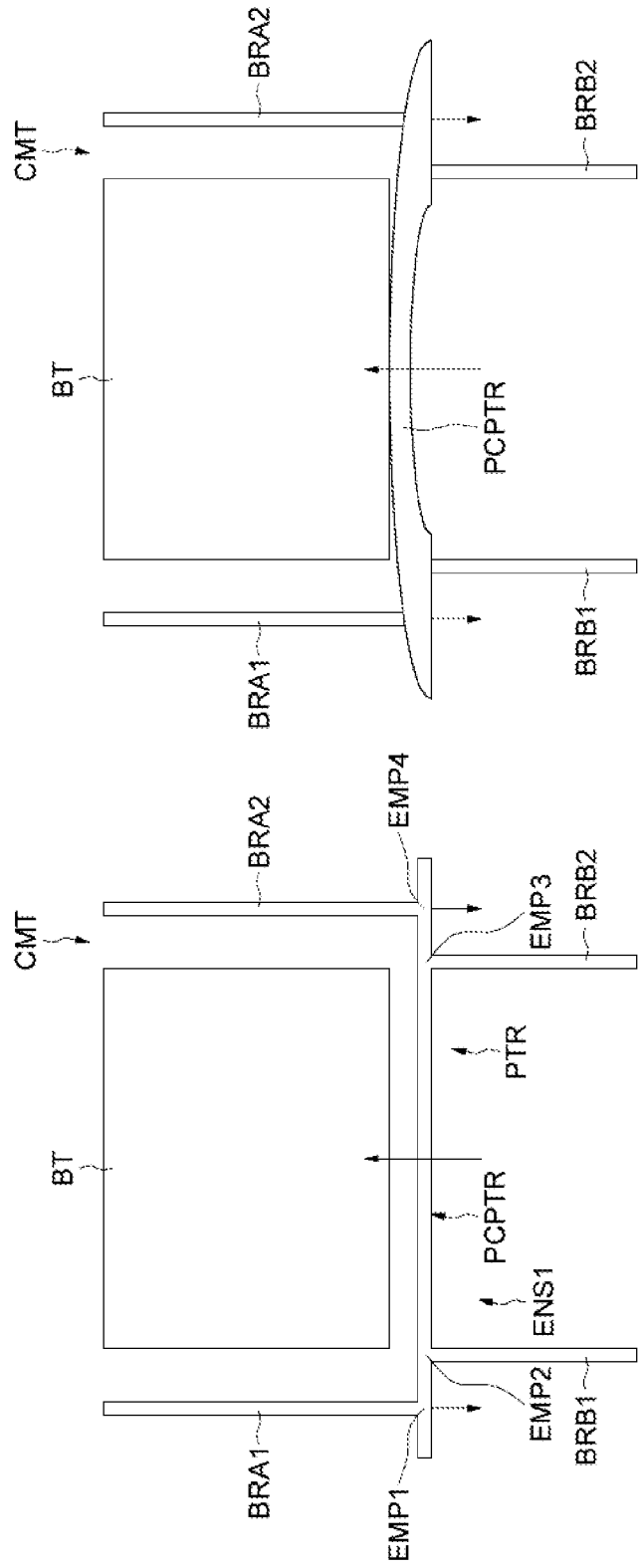
Figure 16:
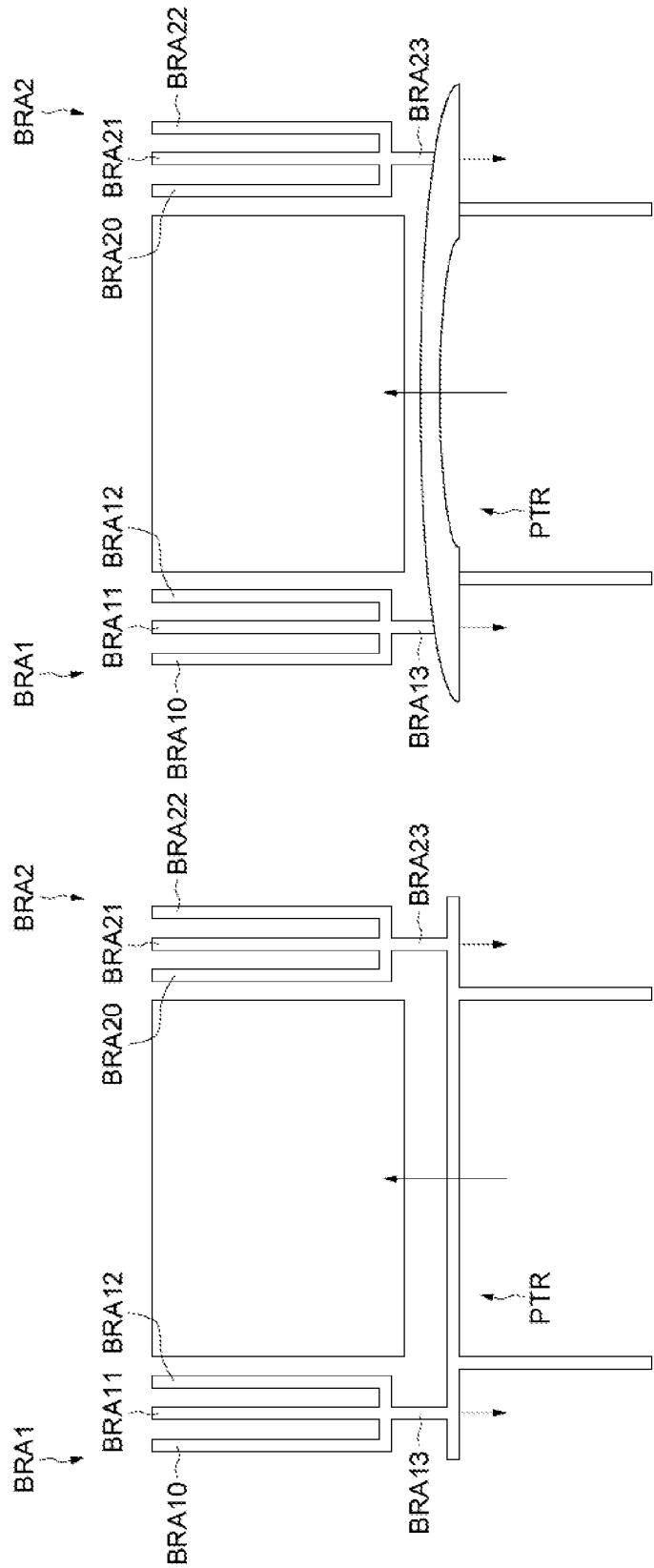

FIGS. 15 and 16 illustrate two other embodiments of the switch CMT.

In FIG. 15, the assembly ENS1 comprises a first pair of first arms BRA1, BRA2, respectively fixed onto a first face of the beam PTR at the locations EMP1 and EMP4 situated in the neighbourhood of the two ends of the beam PTR.

The assembly ENS1 also comprises a second pair of second arms BRB1, BRB2 respectively fixed onto a second face of the beam PTR, opposite to the first face, at two locations EMP2, EMP3 respectively situated in the neighbourhood of the two ends of the part PCPTR of the beam situated between the arms of the first pair BRA1, BRA2.

This part PCPTR of the beam, which includes the central part of the beam, is situated, as illustrated in the left-hand part of FIG. 15, when the assembly ENS1 is in its first configuration, out of contact with the buffer BT.

Of course, here again, the locations EMP1 and EMP2 are spaced out in the longitudinal direction of the beam in the same way as the locations EMP3 and EMP4.

As illustrated in the right-hand part of FIG. 15, in the presence of an increase in temperature of the arms BRA1 and BRA2, whether this increase be caused thermally or electrically by Joule heating, an expansion of the arms BRA1 and BRA2 and of the curvature of the central part PCPTR of the beam takes place which then, in a second configuration, comes into contact with the buffer BT.

An electrical link can then be established between the arms BRA1 and BRA2, the central part of the beam PCPTR and the buffer BT.

The switch CMT illustrated in FIG. 15 is then a switch referred to as "normally open" (or "normally OFF") in the absence of thermal activation.

It would also be possible to form a "normally ON" (normally closed in the absence of thermal activation) selector switch by placing the buffer BT on the other side of the beam in contact with the latter. And, when there is an increase in temperature of the arms BRA1 and BRA2, the central part PCPTR, by curving itself, then moves out of contact with the buffer BT, interrupting the electrical link passing through this buffer BT.

In FIG. 16, each arm BRA1, BRA2 comprises several parallel branches, here three parallel branches BRA10-BRA12 and BRA20-BRA22 respectively connected to the beam PTR by two end parts BRA13 and BRA23 rigidly attached to the beam PTR.

Such an embodiment allows more marked thermal deformations to be obtained.

What is claimed is:

1. An integrated circuit, comprising:
   a plurality of metallization levels separated by an insulating region and disposed on a substrate; and
   a mechanical device for electrical switching comprising:
      a first assembly being thermally deformable and disposed within an enclosure and having a beam held at at least two different locations by at least two arms rigidly attached to edges of the enclosure, the beam and the arms being metal and disposed within a same metallization level; and
      at least one electrically conducting body, the said first assembly having at least a first configuration at a first temperature and a second configuration when at least one of the arms is at a second temperature different from the first temperature;
   wherein the beam is out of contact with the said at least one electrically conducting body in one of the first configuration and second configuration and in contact with the said at least one electrically conducting body in the other of the first configuration and the second configuration and establishing or breaking an electrical link passing through the said at least one electrically conducting body and through the said beam, the said first assembly being activatable for switching from one of the configurations to another configuration.

2. The integrated circuit according to claim 1, wherein the said first assembly comprises the said beam and the two arms rigidly attached to the beam each on one of two respective opposing faces of the said beam, in a central part of the said beam, the two fixing points of the two arms attaching onto the beam being spaced out in a longitudinal direction of the beam.

3. The integrated circuit according to claim 2, wherein the said electrically conducting body comprises two buffers each in contact with one of two respective ends of the beam in one of the first configuration and the second configuration, and out of contact with these buffers in the other of the first configuration and the second configuration.

4. The integrated circuit according to claim 1, wherein the said electrically conducting body comprises a second assembly that is thermally deformable, disposed in the enclosure, the first assembly and second assembly being configured such that the respective beams of the first assembly and the second assembly are in contact in the said second configuration and out of contact in the said first configuration.

5. The integrated circuit according to claim 1, wherein the first assembly comprises a first pair of first arms each fixed onto a first face of the beam at respective ends of the said beam, a second pair of second arms each fixed onto a second face of the said beam, opposite to the first face, at respective ends of the beam and disposed between the arms of the first pair, two respective fixing points onto the beam of a first arm and of a second adjacent arm spaced out in a longitudinal direction of the beam, and wherein the said body comprises a buffer out of contact with a central part of the beam in one of the first configuration and the second configuration and in contact with the said buffer in the other of the first configuration and the second configuration.

6. The integrated circuit according to claim 5, wherein each of the first arms comprises a plurality of branches connected to an end part rigidly attached to a beam.

7. The integrated circuit according to claim 1, in which the first assembly is thermally activatable.

8. The integrated circuit according to claim 7, in which the switching device comprises a second electrically conducting body, the said first assembly further having a third configuration when at least one of the arms has a third temperature different from the first temperature and from the second temperature, the beam out of contact with the first electrically conducting body and the second electrically conducting body in the first configuration, in contact with the said first electrically conducting body in the second configuration so as to establish a first electrical link passing through the said first electrically conducting body and through the said beam, and in contact with the said second electrically conducting body in the third configuration and establishing a second electrical link passing through the said second electrically conducting body and through the said beam.

9. The integrated circuit according to claim 1, furthermore comprising a current source configured to provide an electrical current in at least one of the at least two arms of the said first assembly and raising the at least one of the at least two arms to the said second temperature.

10. A device, comprising:
    at least one first body formed at least in part of an electrically conducting material;
    a beam formed of an electrically conductive material and disposed with an enclosure and within a first metallization layer; and
    at least two first arms rigidly attached to edges of an enclosure and disposed within the first metallization layer, the at least two first arms being thermally deformable, the at least two first arms and the beam forming a first assembly, the at least two first arms configured to move the beam in response to a change in temperature, the first assembly having at least a first configuration at a first temperature and a second configuration when at least one of the at least two first arms is at a second temperature different from the first temperature, the beam out of contact with the at least one first body in the first configuration such that no electrical link passes through the at least one first body and through the said beam, and in contact with the at least one first body in the second configuration such that an electrical link passes through the at least one first body and through the beam.

11. The device according to claim 10, wherein each of the at least two arms are attached to the beam each on one of two respective opposing faces of the said beam at two fixing points in a central region of the beam, the fixing points spaced in a longitudinal direction of the beam.

12. The device according to claim 11, further comprising:
    at least two second arms disposed in the first assembly;
    wherein the at least two first arms are each fixed onto opposite faces of the beam at a first end of the beam, and the at least two second arms are fixed onto opposite faces of the beam at a second end of the beam, the at least two first arms and the at least two second arms configured to move the beam by arching the beam in the second configuration; and
    wherein the said first body comprises a buffer out of contact with a central part of the beam in first configuration in contact with the said buffer in the second configuration.

13. The device according to claim 10, further comprising a second assembly disposed in the enclosure, the first assembly and the second assembly configured such that the respective beams of the first assembly and the second assembly are in contact in the said second configuration and out of contact in the first configuration.

14. The device according to claim 10, wherein at least one of the at least two first arms comprises a plurality of branches connected to an end part attached to the beam.

15. The device according to claim 10, in further comprising a second body formed in least in part of an electrically conductive material, the said first assembly having a third configuration when at least one of the at least two first arms has a third temperature different from the first temperature and from the second temperature, the beam out of contact with the at least one first body and the second body in the first configuration, in contact with the at least one first body in the second configuration so as to establish a first electrical link passing through the at least one first body and through the said beam, and in contact with the second body in the third configuration and establishing a second electrical link passing through the said second body and through the said beam.

16. The device according to claim 10, furthermore comprising a current source configured to provide an electrical current in at least one of the at least two arms of the said first assembly and raising the at least one of the at least two arms to the said second temperature.

17. A device, comprising:
  a first body disposed in an enclosure and formed of a conductive material;
  a first arm attached to the enclosure;
  a second arm attached to the enclosure; and
  a first beam formed of a conductive material, the first arm attached at a first point to a first face of the first beam at a first end of the first beam, the second arm attached at a second point to a second face of the first beam opposite the first face of the first beam, the second point between the first point and a second end of the first beam opposite the first end of the first beam, the first arm and the second arm configured to move the first beam from not being in contact at a second end of the first beam with the first body at a first temperature to being in contact at the second end of the first beam with the first body at a second temperature;
  wherein the first beam establishes an electrical link through the first body and the first beam at the second temperature; and
  wherein the first arm, the second arm and the first beam are formed in a same metallization layer.

18. The device of claim 17, further comprising a second body disposed in the enclosure and formed of a conductive material, wherein the first beam is not in contact with the second body at the first temperature and in contact with the second body and the first body at the second temperature, and wherein the first beam establishes an electrical link through the second body, the first beam and the first body at the second temperature.

19. The device of claim 18, further comprising a measurement circuit connected to the first body and the second body and configured to detect an electrical link through the first body, the first beam and the second body.

20. The device of claim 17, further comprising:
  a second body disposed in the enclosure and formed of a conductive material
  a third arm attached to the enclosure;
  a fourth arm attached to the enclosure; and
  a second beam formed of a conductive material, the third arm attached at a third point to a first face of the second beam at a first end of the second beam, the fourth arm attached at a fourth point to a second face of the second beam opposite the first face of the second beam, the fourth point between the third point and a second end of the second beam opposite the first end of the second beam, the third arm and the fourth arm configured to move the second beam from being separated from the second body and from the first beam at a first temperature to being in contact at the second end with the second body and in contact with the first beam at a first end at a second temperature;
  wherein the first beam and second beam establish an electrical link through the first body and the first beam and through the second beam and the second body at the second temperature.

* * * * *